United States Patent
Wu et al.

(10) Patent No.: US 7,429,501 B1
(45) Date of Patent: Sep. 30, 2008

(54) LID AND METHOD OF EMPLOYING A LID ON AN INTEGRATED CIRCUIT

(75) Inventors: Paul Ying-Fung Wu, Saratoga, CA (US); Soon-Shin Chee, Sunnyvale, CA (US); Steven H. C. Hsieh, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/242,262

(22) Filed: Sep. 30, 2005

Related U.S. Application Data

(63) Continuation of application No. 10/782,184, filed on Feb. 18, 2004, now Pat. No. 7,012,326, which is a continuation-in-part of application No. 10/648,118, filed on Aug. 25, 2003, now abandoned.

(51) Int. Cl.
  *H01L 21/00* (2006.01)
(52) U.S. Cl. .................. 438/121; 257/684; 257/704; 257/710; 438/106
(58) Field of Classification Search ................. 257/684, 257/704, 710, E23.193; 438/106, 121
  See application file for complete search history.

(56) References Cited

U.S. PATENT DOCUMENTS

| | | | |
|---|---|---|---|
| 3,846,824 A | 11/1974 | Bell | |
| 5,105,259 A | 4/1992 | McShane et al. | |
| 5,406,117 A | 4/1995 | Dlugokecki et al. | |
| 5,434,745 A * | 7/1995 | Shokrgozar et al. | 361/735 |
| 5,436,407 A | 7/1995 | Fehr et al. | |
| 5,455,456 A | 10/1995 | Newman | |
| 5,889,323 A * | 3/1999 | Tachibana | 257/704 |
| 5,895,233 A | 4/1999 | Higashi et al. | |
| 5,949,655 A | 9/1999 | Glenn et al. | |

(Continued)

FOREIGN PATENT DOCUMENTS

JP 58140931 2/1985

(Continued)

OTHER PUBLICATIONS

Wu, Paul Ying-Fang et al., "Integrated Circuit Package and Method of Attaching a Lid to a Substrate of an Integrated Circuit", U.S. Appl. No. 11/250,943, filed Oct. 14, 2005, 21 pages, available from Xilinx, Inc., 2100 Logic Drive, San Jose, CA 95124.

*Primary Examiner*—Leonardo Andújar
(74) *Attorney, Agent, or Firm*—John J. King

(57) ABSTRACT

A lid having a plurality of recesses at the edges of the lid to provide an improved adhesive bond between the lid and a substrate of an integrated circuit is disclosed. The plurality of recesses may be a castellation comprising a collection of semi-circular cuts into the originally straight edges of the lid. The castellation can be formed by stamping, etching, molding design, or milling/drilling, all of which are well-known methods in the art of forming lids for integrated circuits. The castellation can be vertically straight or it can be slightly tapered, to provide a better locking of the lid on to the package. Epoxy in the recesses can provide an epoxy post for locking the lid. Method of forming a lid having a plurality of recesses and employing a lid on an integrated circuit are also disclosed.

5 Claims, 5 Drawing Sheets

U.S. PATENT DOCUMENTS

| | | |
|---|---|---|
| 5,998,862 A | 12/1999 | Yamanaka |
| 6,016,006 A | 1/2000 | Kolman et al. |
| 6,037,193 A * | 3/2000 | Interrante et al. ........... 438/122 |
| 6,214,643 B1 | 4/2001 | Chiu |
| 6,225,694 B1 | 5/2001 | Terui |
| 6,249,046 B1 | 6/2001 | Hashimoto |
| 6,262,481 B1 | 7/2001 | Wang |
| 6,274,927 B1 | 8/2001 | Glenn |
| RE37,554 E * | 2/2002 | Brunner et al. ............ 438/116 |
| 6,352,195 B1 | 3/2002 | Guthrie et al. |
| 6,469,897 B2 | 10/2002 | Ho et al. |
| 6,483,702 B1 | 11/2002 | Lofland |
| 6,501,171 B2 | 12/2002 | Farquhar |
| 6,504,096 B2 | 1/2003 | Okubora |
| 6,538,320 B1 * | 3/2003 | Tosaya et al. ............... 257/706 |
| 6,573,590 B1 | 6/2003 | Radu et al. |
| 6,630,743 B2 | 10/2003 | Magnuson et al. |
| 6,693,748 B1 | 2/2004 | Fujimoto et al. |
| 6,713,863 B2 | 3/2004 | Murayama et al. |
| 6,762,796 B1 | 7/2004 | Nakajoh et al. |
| 6,853,068 B1 | 2/2005 | Djekic |
| 6,882,535 B2 | 4/2005 | Labanok et al. |
| 7,057,276 B2 | 6/2006 | Lin et al. |
| 2002/0100969 A1 | 8/2002 | Farquhar |
| 2003/0067070 A1 | 4/2003 | Kwon et al. |
| 2004/0174682 A1 * | 9/2004 | Lin et al. .................... 361/705 |
| 2004/0238947 A1 | 12/2004 | Rumer et al. |

FOREIGN PATENT DOCUMENTS

| | | |
|---|---|---|
| JP | 60031253 A2 | 2/1985 |
| JP | 60160146 A * | 8/1985 |
| JP | 08211913 | 2/1998 |
| WO | WO 00/69239 | 11/2000 |

\* cited by examiner

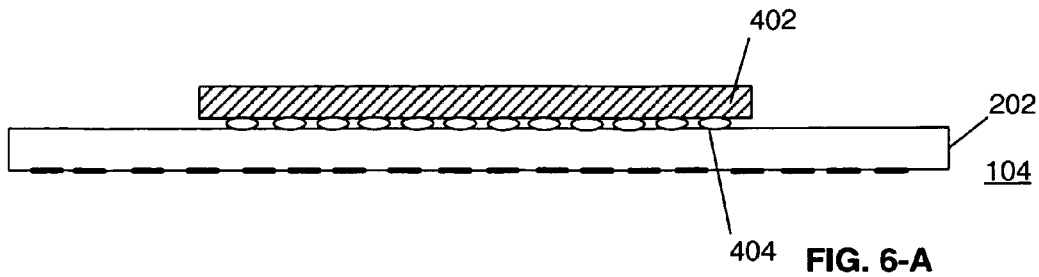
FIG. 6-A
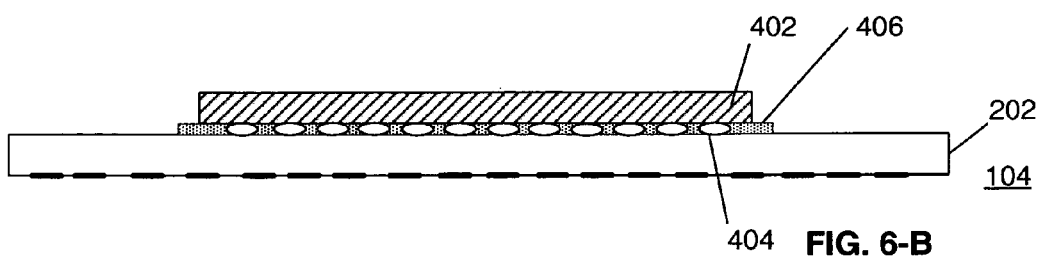
FIG. 6-B
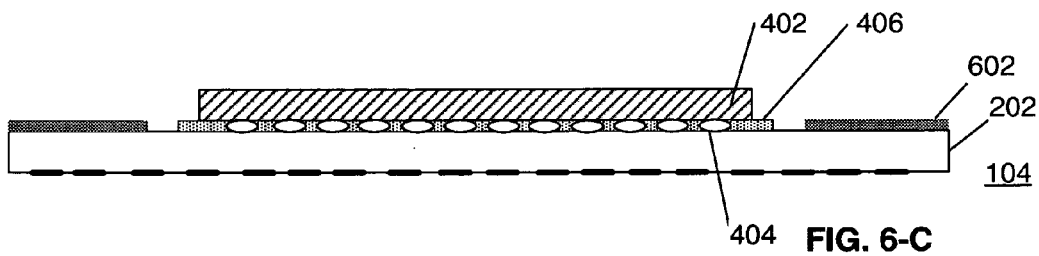
FIG. 6-C
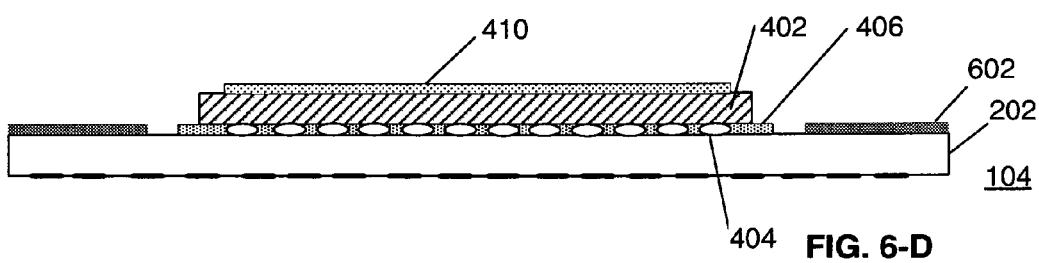
FIG. 6-D
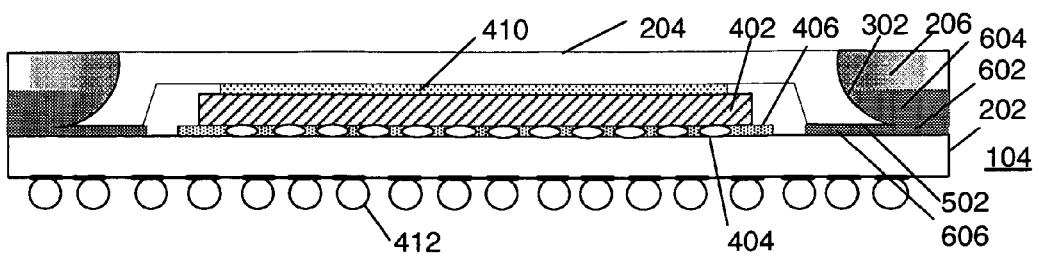
FIG. 6-E

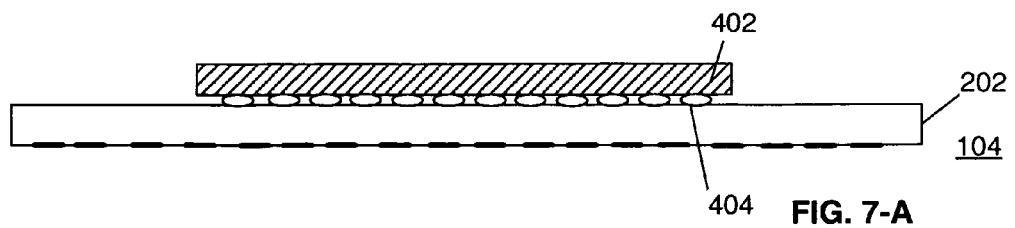
FIG. 7-A
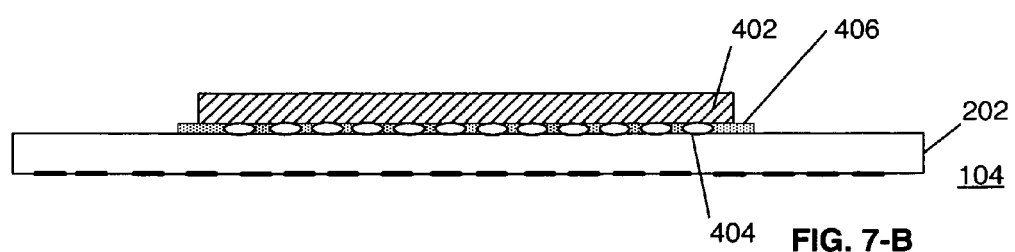
FIG. 7-B
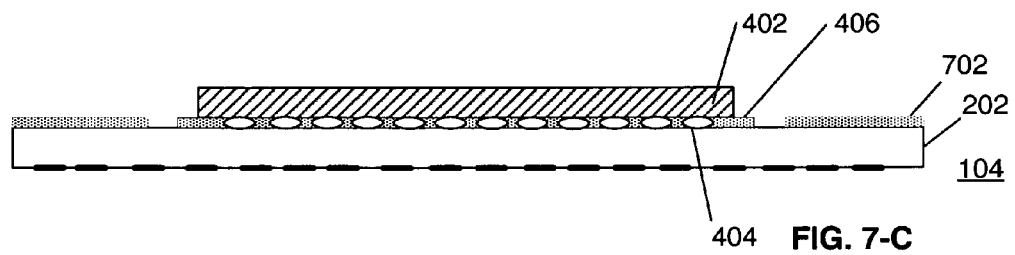
FIG. 7-C
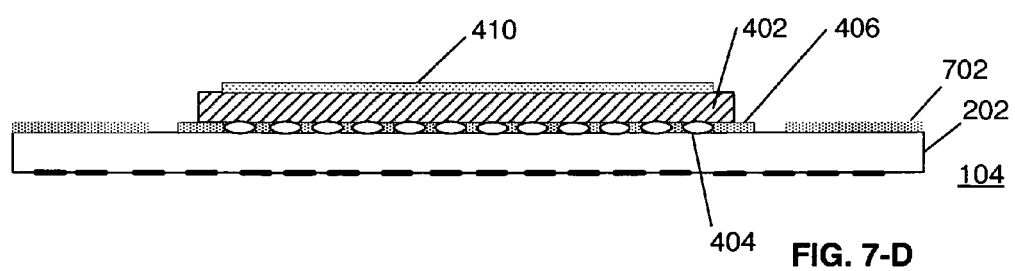
FIG. 7-D
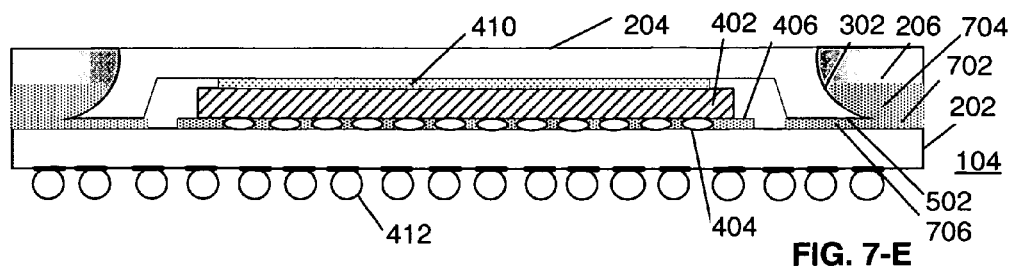
FIG. 7-E

LID AND METHOD OF EMPLOYING A LID ON AN INTEGRATED CIRCUIT

FIELD OF THE INVENTION

The present invention relates generally to a lid for an integrated circuit, and in particular, to a method of securing a lid to an integrated circuit.

BACKGROUND OF THE INVENTION

Heat sinks are used in a variety of electronic devices to dissipate heat from the device, preventing any failure of or damage to the device. Heat sinks are made of a variety of heat conducting materials and are formed in a variety of shapes to adequately conduct the heat from the device. One application of a heat sink is a lid used with an integrated circuit to reduce the heat of the semiconductor die to enable the integrated circuit to function properly. One purpose of the lid is to keep a semiconductor junction, such as a junction of the transistor, below a maximum specified operating temperature.

Typically, flip chip packages are thermally enhanced ball grid arrays (BGAs) with die facing down. They are provided with an exposed metal heat sink at the top. These are considered high-end thermal packages and lend themselves to the application of external heat sinks, either passive or active, for further heat removal efficiency. However, these types of conductive lid heat sinks often exhibit the problem of separating from the top of an integrated circuit package. Because the adhesion strength of the adhesive is sometimes not strong enough to hold the conductive lid to the package, the conductive lid can come off of the package.

A lid for an integrated circuit, commonly made of a metallic or ceramic material, is attached on top of a flip chip package to provide protection to the silicon die and other discrete surface mount components and to increase thermal conductivity of the package. Proper material construction and processing of the lid, the package, and the adhesive is required so that the lid will stay attached to the package during the assembly and long term field usage. Degradation of the adhesive can be caused by many factors, including improper dispensing of adhesive that does not produce full adhesive surface as designed, shear stresses introduced by thermal expansion/shrinkage differences at the interfaces, push/pull stresses introduced by silicon/package/board warpage, adhesive degradation due to chemical attack, etc. Excessive component handling stresses during test, assembly, or rework, such as excessive torque or pressure, can also result in separation of the lid from the package.

Accordingly, there is a need for an improved lid for an integrated circuit and method of securing a lid to an integrated circuit.

SUMMARY OF THE INVENTION

According to one embodiment of the present invention, a lid having a plurality of recesses at the edges of the lid to provide an improved adhesive bond between the lid and a substrate of an integrated circuit is disclosed. The plurality of recesses may be a castellation comprising a collection of semi-circular cuts into the originally straight edges of the lid. The castellation may be formed by stamping, etching, molding design, or milling/drilling, all of which are well-known methods in the art of forming lids for integrated circuits. The castellation can be vertical or it can be slightly tapered to provide a better locking of the lid to the package. Adhesive in the recesses can provide an adhesive post for locking the lid to the substrate.

According to one aspect of the invention, the castellation enables a visual inspection of the application of an adhesive to secure the lid to the substrate of the integrated circuit. Unlike the straight edges of conventional lids where the dispense pattern of the adhesive can not be easily checked, resulting in an under dispensed adhesive pattern to escape inspection or other forms of detection, the adhesive should be partially present in each castellation site. Because the adhesive should not smear out from the non-castellated straight edges, it is possible to provide a visual check to ensure proper adhesive dispense coverage along the entire edge. According to another aspect of the present invention, a solder bond enables the lid having a plurality of recesses to be secured to the substrate. Finally, methods of securing the lid to a substrate are also disclosed.

BRIEF DESCRIPTION OF THE DRAWINGS

FIG. 6 is a series of figures showing the formation of an integrated circuit according to an embodiment of the present invention;

FIG. 7 is a series of figures showing the formation of an integrated circuit according to an alternate embodiment of the present invention;

DETAILED DESCRIPTION OF THE DRAWINGS

Figure 1:
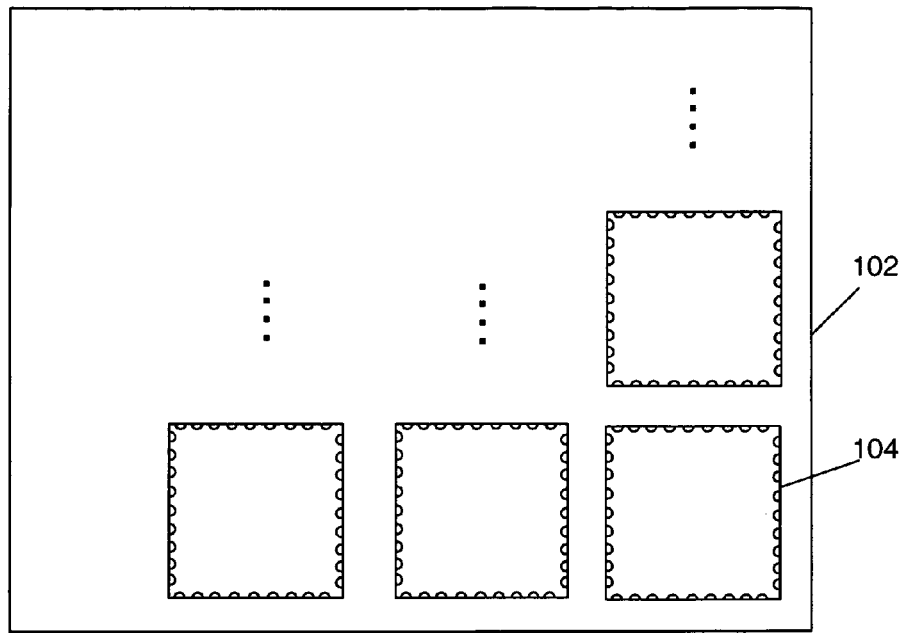
FIG. 1 is a top plan view of a printed circuit board having a plurality of components according to an embodiment of the present invention.
Figure 2:
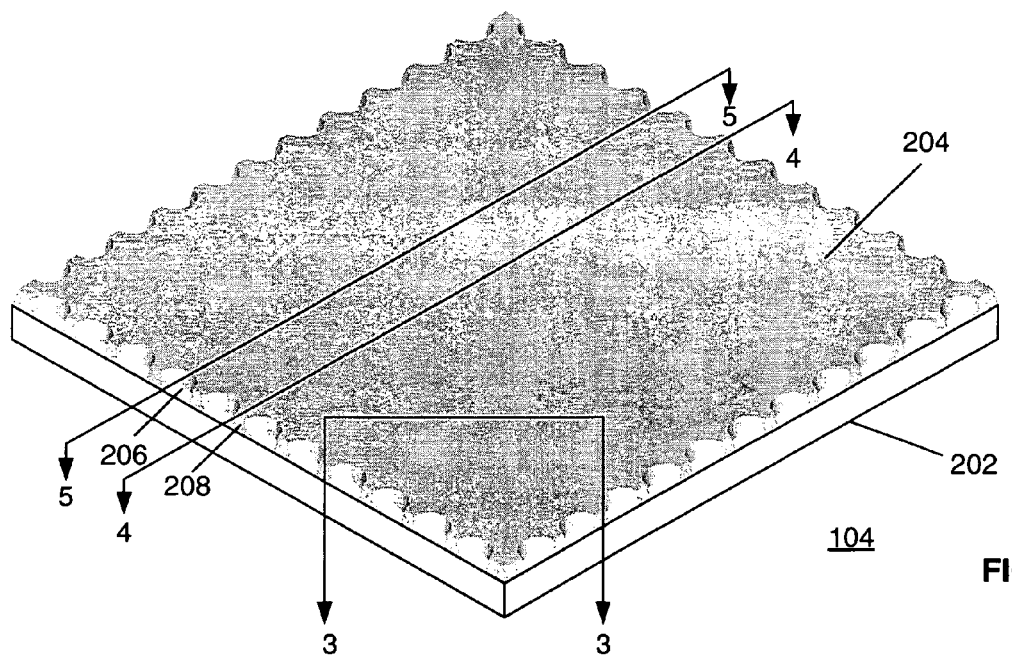
FIG. 2 is a perspective view of a component 104 according to an embodiment of the present invention.

Turning first to FIG. 1, a top plan view of a printed circuit board having a plurality of components according to an embodiment of the present invention is shown. In particular, a printed circuit board 102 comprises a plurality of components 104, such as a BGA having a lid according to the present invention. A perspective view of a component 104 according to an embodiment of the present invention comprises a substrate 202 and a lid 204 as shown in FIG. 2. Also shown in FIG. 2 are the recesses 206 and edge walls 208 that are positioned along the four sides of the lid 204. Additional details of the lid 204 will be described in more detail in reference to the partial-sectional view showing an enlarged portion of the component 104 taken at lines 3-3, the cross-sectional view of component 104 taken at lines 4-4 through an edge wall 208, and the cross-sectional view of component 104 taken at lines 5-5 through a recess 206.

Figure 3:
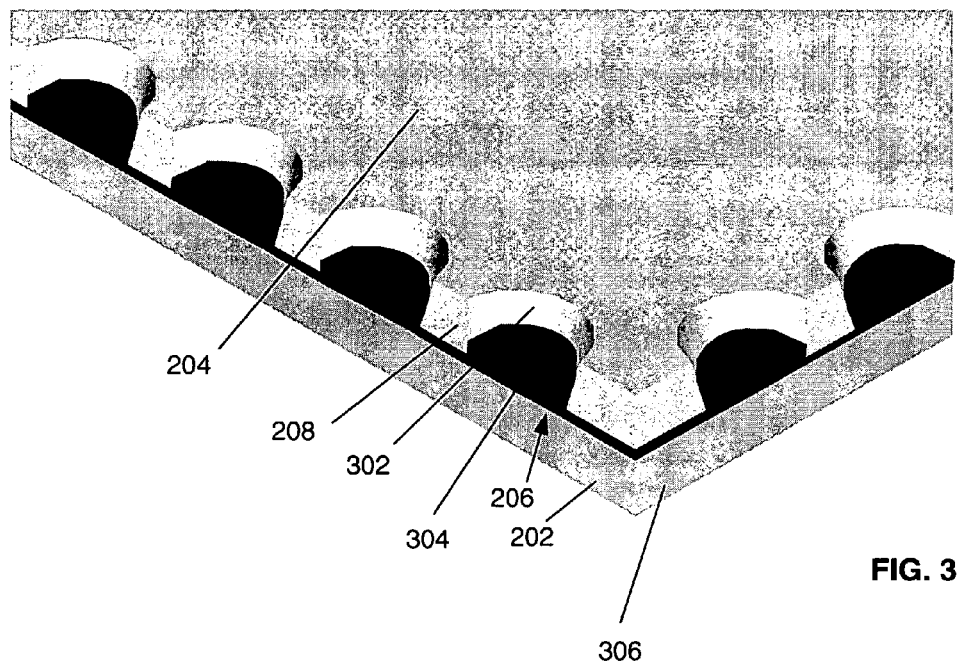
FIG. 3 is a partial-sectional view showing an enlarged portion of the component 104 of FIG. 2.

Turning now to FIG. 3, a partial-sectional view shows an enlarged portion of the component 104 taken at lines 3-3. In particular, the recesses 206 can be seen in more detail. According to one embodiment of the present invention, recesses 206 comprise semi-circles. As shown in FIG. 3, the semi-circle recesses have beveled edges 302 which comprise partial conical surfaces. The recesses 206 may be formed, for example, by stamping, etching, molding design, injection molding or milling/drilling, all of which are well-known methods in the art of forming lids for integrated circuits. As will be described in more detail in reference to the remaining figures, excess bonding agent between the lid 204 and the substrate 202 forms a bond post 304 for locking the lid to the substrate. Advantageously, the recesses expose the bonding agent to allow, for example, visual inspection of the bond between the lid and the substrate. Also shown is a corner 306 of the lid between two end recesses on adjacent sides of the lid. Although the recesses are formed as partial conical structures at the edges of the lid, the recesses may be cylindrical or conical holes extending through the foot of the lid, as shown in co-pending U.S. application Ser. No. 10/648,118 entitled "Conductive Lid and Method of Employing a Conductive Lid in an Integrated Circuit," filed Aug. 25, 2003 and assigned to the assignee of the present invention, the entire application of which is incorporated herein by reference.

Figure 4:
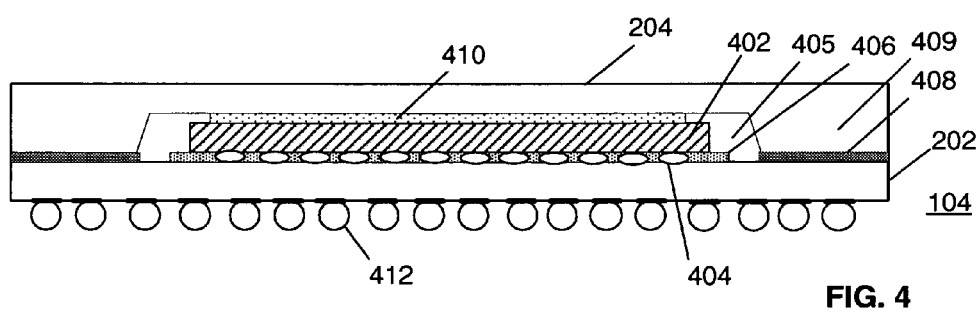
FIG. 4 is a cross-sectional view of component 104 taken at lines 4-4 of FIG. 2.

Turning now to FIG. 4, a cross-sectional view of component 104 taken at lines 4-4 is shown. In particular, component 104 comprises a BGA having a flip chip 402 coupled to the substrate 202 by a plurality of solder bumps 404. The flip chip 402 and any other components are positioned within a recessed portion 405 of the lid 204. The lid may be a square having an approximate thickness between 0.5 mm and 3 mm, although other shapes and/or thicknesses may be used. Also shown in the cross sectional view is an underfill layer 406 between the flip chip 402 and the substrate 202. A bonding agent 408 enables a foot portion 409 of the lid to be secured to the substrate 202. Because the cross section is taken through an edge wall 208, a foot portion 409 extends from the recess 405 to the end of the substrate 202. Finally, a thermal gel 410 can be used to secure the lid to the flip chip 402. The thermal gel may be, for example, lid attach epoxy from AI Technology, Inc., Princeton Junction, N.J. The thermal gel is generally thermally conductive and a soft adhesive.

Figure 5:
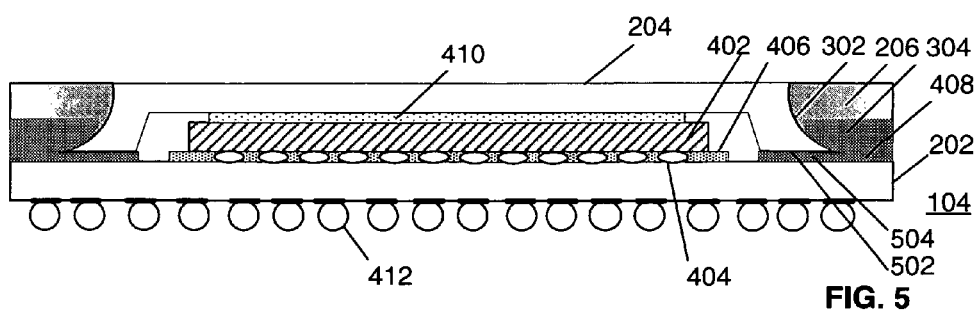
FIG. 5 is a cross-sectional view of component 104 taken at lines 5-5 of FIG. 2.

As can be seen in the cross-sectional view of component 104 taken at lines 5-5, the reduced foot portion 502 remaining after the formation of the recess 206 provides a bond 504 between the lid 204 and the substrate 202. The bonding feature of bond post 304 can also be seen in more detail. By applying a bonding agent according to any embodiment of the present invention, the enhanced bonding strength provides long term stability and allows the footprint width requirement to be significantly reduced. For example, the width of the foot portion 502 can be reduced from a width of approximately 4 mm width to approximately 2 mm. This is beneficial for enabling packages with large die and/or multiple discrete components to be accommodated within a lid. Also, although a flip chip is shown in the cross sections of FIGS. 4 and 5, any other element may be employed in the component 104. For example, a chip lead component or any type of discrete component may be employed according to various embodiments of the present invention.

Turning now to FIG. 6, a series of figures having cross-sectional views shows the formation of an integrated circuit according to an embodiment of the present invention. In particular, a flip chip 402 having a plurality of solder bumps 404 are coupled to a substrate 202 as shown in FIG. 6-A. An underfill layer 406 is then applied as shown in FIG. 6-B. The underfill layer may be any material well known in the art of semiconductor manufacturing. A bonding agent is then applied to the substrate. The bonding agent is preferably provided around the perimeter of the substrate. A portion of the bonding agent is shown as an adhesive layer 602 in FIG. 6-C. The adhesive may be an epoxy adhesive from Bondline Electronic Adhesive, Inc., San Jose, Calif., for example, or any other adhesive well know in the art of semiconductor manufacturing. A thermal gel 410 may then be applied between the lid and the die as shown in FIG. 6-D. Finally, the lid 204 is attached and solder balls 412 are applied to the substrate as shown in FIG. 6-E. A portion of the adhesive extends over the beveled edge 302 to form an adhesive bond post 604. Also, an adhesive bond 606 is provided to the reduced foot portion 502.

Turning now to FIG. 7, a series of figures having cross-sectional views shows the formation of an integrated circuit according to an alternate embodiment of the present invention. The lid of the present invention can be attached to the package by soldering or surface mount solder reflow, which is a reliable method for attaching electronic components. The solder bonding can provide stronger and more stable and reliable adhesion. In particular, a flip chip 402 having a plurality of solder bumps 404 are coupled to a substrate 202 as shown in FIG. 7-A. An underfill layer 406 is then applied as shown in FIG. 7-B. A solder layer 702 is then preferably provided around the perimeter of the substrate as shown in FIG. 7-C. The solder layer is preferably on top of a receiving surface on the substrate with a suitable metal surface such as a nickel/gold (Ni/Au) plated copper (Cu) pad, or an organic surface protection (OSP) protected copper surface. Alternatively, solder paste from Senju Metal Industry Co. of Japan or any other solder well know in the art of semiconductor manufacturing may be used. A thermal gel 410 may then be applied as shown in FIG. 7-D. Finally, the lid is attached and solder balls 412 are attached as shown in FIG. 7-E. A portion of the solder extends over the beveled edge 302 to form a solder bond post 704. Also, a solder bond 706 is provided to the reduced foot portion 502.

The use of solder in providing a mechanical bond according to the embodiment of FIG. 7 also provides other benefits. For example, the package/device ground net can be electrically connected to the lid, if the lid is made of a conductive material, thus providing good ground shielding of the component. A further advantage of solder bonding is that solder is generally more immune to chemical attack, such as a by-product of cleaning during assembly and surface mount, than an adhesive bond such as epoxy. Solder is also generally more robust against moisture and temperature induced weakening of bonds.

Figure 8:
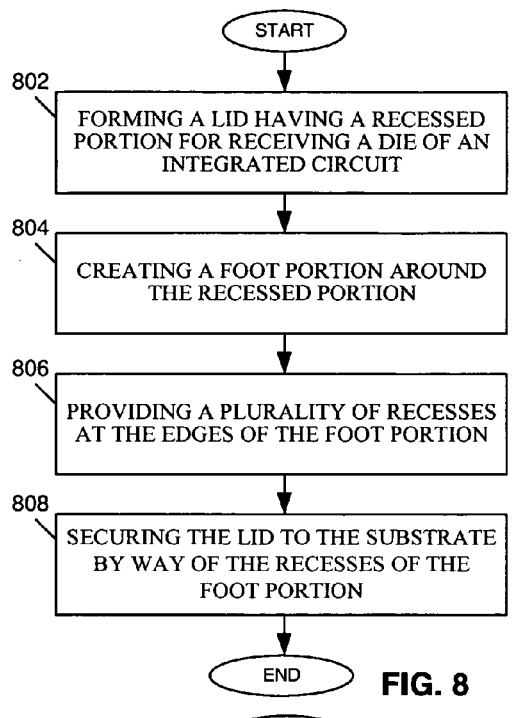
FIG. 8 is a flow chart showing a method of forming a lid according to an embodiment of the present invention.

Turning now to FIG. 8, a flow chart shows a method of forming a lid according to an embodiment of the present invention. A lid having a recessed portion for receiving a die of an integrated circuit is formed at a step 802. A foot portion is created around the recessed portion at a step 804. A plurality of recesses is provided at the edges of the foot portion at a step 806. The recesses on the lid may be, for example, the recesses shown in the embodiment of FIGS. 1-3. Finally, the lid is secured to the substrate by way of the foot portion and the recesses at a step 808. That is, a portion of the adhesive preferably extends over an edge of the recess to form a bond post. The lid may be secured to the substrate according to any of the bonding methods described in reference to FIGS. 6 and 7, for example.

Figure 9:
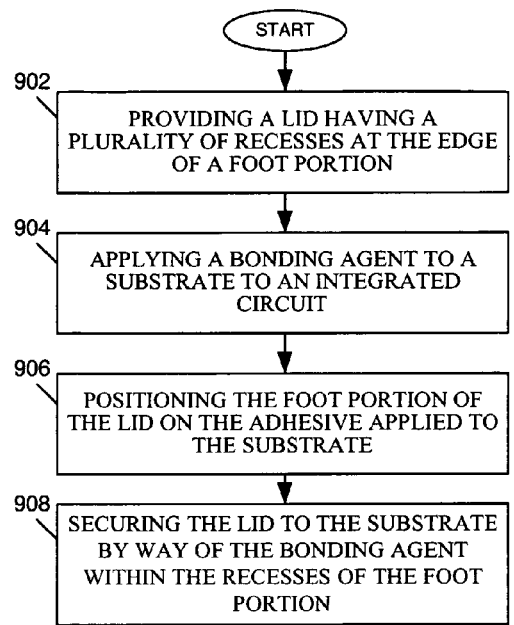
FIG. 9 is a flow chart showing a method of applying a lid to an integrated circuit according to an embodiment of the present invention.

Turning now to FIG. 9, a flow chart shows a method of applying a lid to an integrated circuit according to an embodiment of the present invention. A lid having a plurality of recesses at the edge of a foot portion, such as the lid described in reference to FIGS. 1-3, is provided at a step 902. A bonding agent is applied to a substrate of an integrated circuit at a step 904. The foot portion of the lid is positioned on the adhesive applied to the substrate at a step 906. Finally, the lid is secured to the substrate by way of the bonding agent within the recesses of the foot portion at a step 908.

Figure 10:
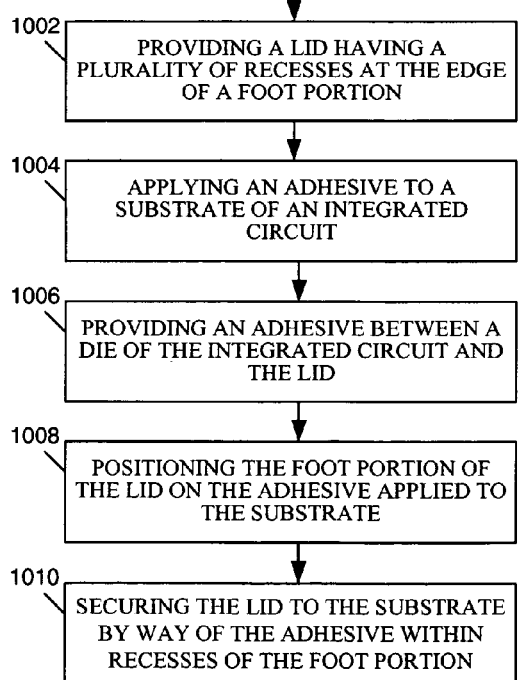
FIG. 10 is a flow chart showing a method of securing a lid to an integrated circuit using an adhesive according to an embodiment of the present invention.

Turning now to FIG. 10, a flow chart shows a method of securing a lid to an integrated circuit using an adhesive according to an alternate embodiment of the present invention. A lid having a plurality of recesses at the edge of a foot portion is provided at a step 1002. An adhesive is applied to a substrate of an integrated circuit at a step 1004. An adhesive is then optionally applied between a die of the integrated circuit and the lid at a step 1006. The foot portion of the lid is positioned on the adhesive applied to the substrate at a step 1008. Finally, the lid is secured to the substrate by way of the adhesive below the foot portion and within recesses at a step 1010. The materials and/or steps for securing the lid to an integrated circuit may be, for example, the materials and steps described in reference to FIG. 6.

Figure 11:
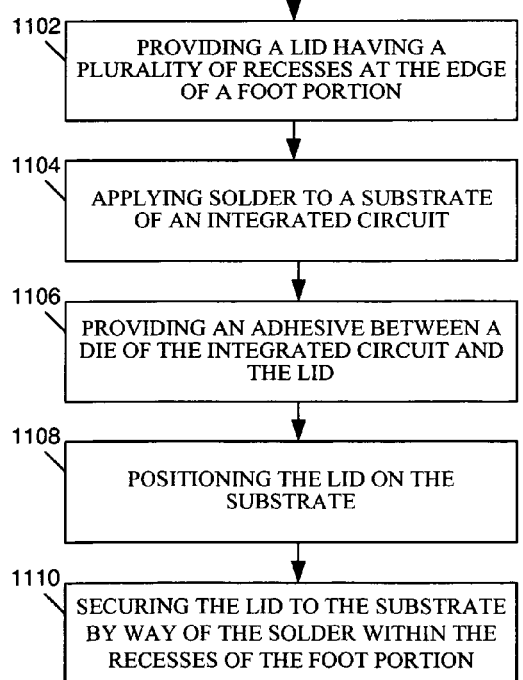
FIG. 11 is a flow chart showing a method of securing a lid to an integrated circuit using solder according to an embodiment of the present invention.

Turning now to FIG. 11, a flow chart shows a method of securing a lid to an integrated circuit using solder according to an alternate embodiment of the present invention. A lid having a plurality of recesses at the edge of a foot portion is provided at a step 1102. Solder is applied to a substrate of an integrated circuit at a step 1104. An adhesive is then optionally applied between a die of the integrated circuit and the lid at a step 1106. The foot portion of the lid is then positioned on the solder applied to the substrate at a step 1108. Finally, the lid is secured to the substrate by way of the solder below the foot portion and within recesses of the foot portion at a step 1110. The lid may be attached to the package by, for example, soldering or surface mount solder reflow. The materials and/or steps for securing the lid to an integrated circuit may be, for example, the materials and steps described in reference to FIG. 7.

It can therefore be appreciated that the new and novel lid for an integrated circuit and method of forming a lid and securing a lid to an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of forming a lid for an integrated circuit, said method comprising the steps of:
    forming a recessed portion within a plurality of sides and a top of said lid for receiving a die of said integrated circuit;
    creating a foot portion of said plurality of sides around said recessed portion and extending a width from said recessed portion; and
    providing a plurality of recesses at external edges of said foot portion, each recess of said plurality of recesses comprising a beveled edge extending inward from an outer wall of a side of said lid and from said foot portion to said top of said lid, leaving said foot portion with a reduced width at said plurality of recesses.

2. The method of claim 1 wherein said step of creating a foot portion comprises creating a planar surface adapted to be attached to a substrate of an integrated circuit.

3. The method of claim 1 wherein said step of providing a plurality of recesses at the edges of said foot portion comprises creating recesses having beveled edges.

4. The method of claim 1 wherein said step of providing a plurality of recesses at the edges of said foot portion comprises at least one of stamping, etching, milling, and drilling said plurality of recesses.

5. The method of claim 1 wherein said steps of forming, creating and providing are performed by injection molding.

* * * * *